United States Patent [19]

Kautter et al.

[11] Patent Number: 4,939,453
[45] Date of Patent: Jul. 3, 1990

[54] PROBE FOR USE WITH CIRCUITRY FOR MONITORING SIGNALS EMANATING FROM HEATED TIP OF SOLDERING IRON OR SOLDER EXTRACTOR OR THE LIKE

[75] Inventors: William J. Kautter, Columbia; Mark D. Wecht, Reisterstown; Louis A. Abbagnaro, Silver Spring, all of Md.

[73] Assignee: Pace Incorporated, Laurel, Md.

[21] Appl. No.: 158,781

[22] Filed: Feb. 22, 1988

[51] Int. Cl.⁵ ............................................. G01R 1/06
[52] U.S. Cl. .............................. 324/158 P; 324/158 F
[58] Field of Search ............ 324/158 P, 158 F, 57 N; 219/233, 234, 240, 241

[56] References Cited

U.S. PATENT DOCUMENTS

| | | | |
|---|---|---|---|
| 4,573,010 | 2/1986 | Barker | 324/158 P |
| 4,639,618 | 1/1987 | Olesen . | |
| 4,764,723 | 8/1988 | Strid | 324/158 P |
| 4,820,975 | 4/1989 | Diggle | 324/158 P |

OTHER PUBLICATIONS

DOD—STD—2000—1B, pp. 51–52, Jun. 10, 1986 (Appendix A).

*Primary Examiner*—Reinhard J. Eisenzopf
*Assistant Examiner*—Edward Urban
*Attorney, Agent, or Firm*—Sixbey, Friedman, Leedom & Ferguson

[57] ABSTRACT

A probe for use with circuitry for monitoring signals emanating from a heated electrical appliance, the probe including a planar member having three layers, the first layer including at least a first electrically conductive portion adapted to support a piece of solder, the second layer being an electrically insulating layer disposed between the first layer and a third layer, the third layer being electrically conductive. A novel method and circuit using the above probe are also disclosed wherein a heated soldering iron or solder extractor tip or the like melts the piece of solder to establish good electrical connection for the signals from the tip to the monitor circuit through the molten solder and the first portion of the first layer.

12 Claims, 2 Drawing Sheets

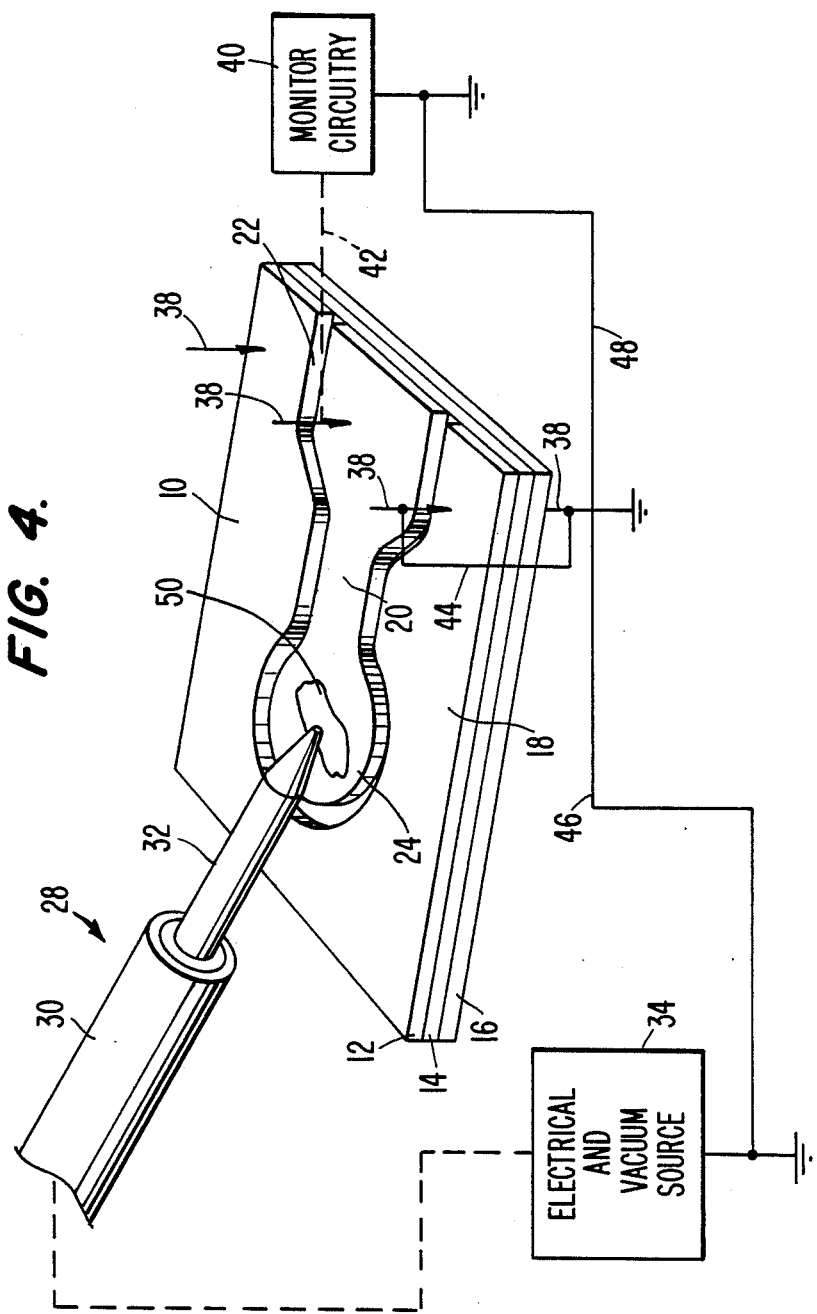

PROBE FOR USE WITH CIRCUITRY FOR MONITORING SIGNALS EMANATING FROM HEATED TIP OF SOLDERING IRON OR SOLDER EXTRACTOR OR THE LIKE

BACKGROUND AND SUMMARY OF THE INVENTION

This invention relates to probes for use with circuitry for monitoring signals emanating from the heating tip of a soldering iron or solder extractor or the like.

Monitors are known for measuring electrical signals emanating from electrical appliances such as a soldering or desoldering station to ensure compliance with various military and/or commercial specifications. For example, a monitor may measure (a) the impedance of the tip of a soldering iron or solder extractor where an alarm is activated whenever the impedance exceeds a predetermined value such as two ohms; (b) leakage where an alarm is activated whenever the leakage voltage at the iron or extractor tip exceeds a predetermined value such as 2 mV; or (c) transients where a high frequency circuit may sense transient voltages to to MHz, for example, and transient power to frequencies above 100 MHz and where an alarm would be activated whenever peak voltages exceed 250 mV, for example. A spike detector circuit, which may be used with the present invention in transient analysis, is disclosed in U.S. Pat. No. 4,639,618 granted January 27, 1987 and assigned to the assignee of the subject application, the foregoing patent being incorporated herein by reference.

It is desirable to test soldering iron or solder extractor tips or the like in their operating condition—that is, the tip should be heated to the desired solder melting temperature. Probes are known which comprise a pot of molten solder into which the heated tip is inserted, the molten solder being electrically connected to the monitor circuit to effect measurements of the above type. However, the solder pot probe of the prior art is quite cumbersome to use and maintain. Moreover, it is rather expensive and, accordingly, inconvenient to replace.

Accordingly, it is a primary object of this invention to provide a probe for a monitor of the type which is easy to use and maintain and inexpensive to manufacture.

Moreover, it is a further primary object of this invention to provide a probe of the above type which may be plugged into the monitor and which may be easily removed and replaced whenever necessary.

These and other objects of the invention will become apparent from a reading of the following description of the invention together with the drawing.

BRIEF DESCRIPTION OF THE DRAWING

FIG. 4 is a diagrammatic illustration of the probe of the present invention showing a typical use thereof.

DETAILED DESCRIPTION OF PREFERRED EMBODIMENTS OF THE INVENTION

Figure 1:
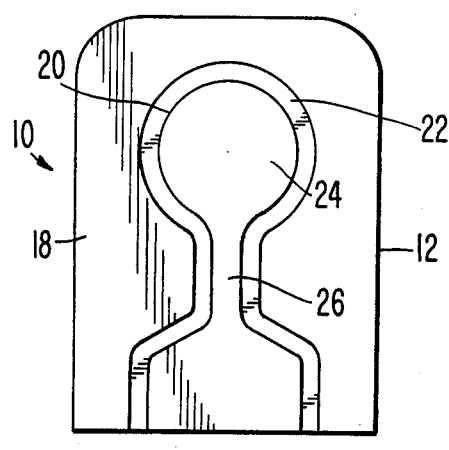
FIG. 1 is a plan view of an illustrative probe in accordance with the present invention.

Reference should now be made to the drawing where the use of like reference numerals refers to like parts in the various figures of the drawing.

Figure 2:
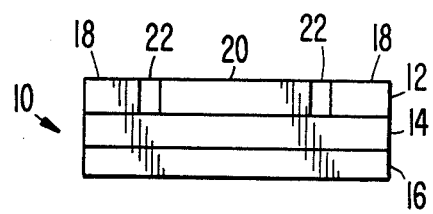
FIG. 2 is an end view of the probe of FIG. 1.
Figure 3:
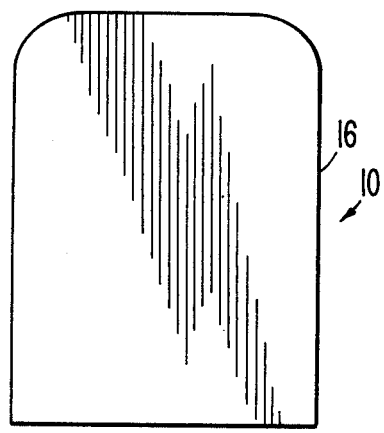
FIG. 3 is a bottom view of the probe of FIG. 1.

Referring to FIGS. 1-3 of the drawing, an illustrative probe 10 in accordance with the invention includes, as shown in FIG. 2, three laters 12, 14 and 16, the layer 12 being shown in plan view in FIG. 1 and the layer 16 in plan view in FIG. 3. Layer 12 comprises an outer portion 18, and inner portion 20 where the inner and outer portions are separated by an air gap 22. The inner portion 20 and the outer portion 18 of layer 12 and the layer 16 may each comprise (a) plated copper, (b) Kovar, or (c) any other suitable corrosion resistive, electrically conductive material. An electrically insulating material may be disposed in gap 22. Layer 14 comprises an electrically insulating material such as G-10 used for printed circuit boards or the like. The layers 12 and 16 may be bonded to layer 14 in any known manner and preferably are bonded by techniques well known in the formation of printed circuits. Moreover, the pattern of inner portion 20 may be formed by conventional PCB etching techniques. Thus, the probe as constructed above simulates to a high degree of accuracy, the actual PCB environment which a soldering iron or extractor would normally come in contact with. Hence, any electrical signals eminating from the tip or the like are monitored under realistic operating conditions.

Inner portion 20 of layer 14 includes an enlarged area 24 which is adapted to receive a pool 50 (see FIG. 4) of solder or the like. In particular, solder is typically melted on the end of a solder tip or the like after which it is applied to inner portion 20 to form the solder pool 50. Subsequently this pool may solidify, however, when need for establishing an electrical connection, it would be melted again by a heated tip. Moreover, the solder of the pool would be replenished as needed. Although inner portion 20 of layer 14 includes a narrow portion 26, this portion may be as wide as the width of the enlarged portion 24 or even larger. However, the configuration of FIG. 1 is preferred because enlarged area 24 presents a target-like area upon which the solder pool may be placed.

Reference should now be made to FIG. 4 wherein a solder extractor is indicated at 28 in FIG. 4, the solder extractor illustratively being of the type illustrated in U.S. Pat. Nos. 3,392,897 or 4,225,076, which are incorporated herein by reference. Alternatively, a soldering iron may be employed. The solder extractor 28 includes a housing 30 for receiving a tip 32, the housing 30 typically including a heater coil or the like for heating tip 32 to at least solder melt temperature. A source 34 provides, in a known manner, electrical current to the heater coil of the extractor and also provides vacuum through tip 32.

Figure 5:
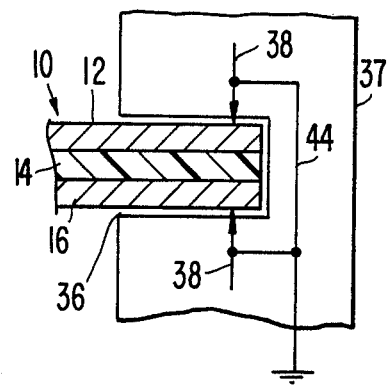
FIG. 5 is a diagrammatic illustration of a connector for use with the probe of FIG. 1.

The probe 10 is insertable in a recess 36 of a connector 37 diagrammatically indicated in FIG. 5, such connectors being known such as those sold by EDAC, Inc. under the model designation 307-012-558-201. Within the connector are biased contacts 38 which make contact with the electrically conductive surfaces of probe 10, these contacts being diagrammatically illustrated.

As can be seen in FIG. 4, the contact 38 which engages inner portion 20 of layer 12, is connected to known electrical monitor circuitry 40, the connection being diagrammatically indicated at 42.

In order to ensure a good connection to ground, the outer portion 18 of layer 12 and layer 16 function as ground planes which are engaged by contacts 38 as shown in FIG. 5. As indicated at 44 in FIGS. 4 and 5, the contacts engaging the portion 18 and plane 16 are electrically connected together to ground. Moreover, the ground of the probe is also preferably connected to the ground of the electrical and vacuum source 34 at 46 and to the ground of the monitor circuit 40 at 48.

In operation, the pool of solder 50, is formed on enlarged area 24 in the manner described above and thus a good electrical connection is provided between tip 32 and monitor circuitry 40 via (a) the molten solder resulting from the heating of pool 50 and (b) the inner portion 20 of layer 14.

thus the probe allows measurements with the unit under test in operating condition—that is, the tip is heated to a desired idle temperature such as at least solder melt temperature. As can be seen in FIG. 5 the probe may plug into the front of connector 37, which connector may be disposed in the front of monitor 40. Accordingly, the probe is easily removed and replaced whenever necessary. The probe is activated with the pool of molten solder, as discussed above, and tip measurements are made in the molten solder environment to ensure good electrical contact.

It can thus be seen that to test a soldering or desoldering station such as source 34, one need merely touch the inner portion 20 of probe 10 with the tip 32 until solder melt occurs. The probe should be regularly replenished with solder as required to maintain good continuity.

In alternative embodiments of the invention, either ground portion 18 of layer 14 or ground layer 16 of the probe may be eliminated. Moreover, the entirety of layer 12 may act as the active layer corresponding to inner portion 20 while layer 16 may be employed as the ground layer. The arrangement of FIG. 1 is preferred in those instances where stray electrical noise may undesirably affect the signal from active portion 20. Accordingly, in the latter instances ground portion 18 acts as an electrical shield for active portion 20 to reduce or eliminate the electrical noise.

These and other modifications of the invention are included within the invention as defined by the claims appended hereto.

What is claimed is:

1. A circuit for monitoring electrical signals emanating from a heated electrical appliance, said circuit comprising:
   a planar probe having three layers, the first layer including at least a first electrically conductive portion adapted to support a pool of molten solder, the second layer being an electrically insulating layer disposed between the first layer and a third layer, the third layer being electrically conductive and grounded; and
   circuit means connected to said first portion of said first layer of the probe to monitor said electrical signals emanating from said heated appliance through the molten solder pool and said first portion of the first layer of the probe to said circuit means.

2. A circuit as in claim 1 wherein said first layer includes a second portion electrically isolated from the first portion where said second portion is grounded.

3. A circuit as in claim 1 including wherein said heated appliance is grounded and wherein said circuit means includes means for connecting the ground of the third layer to the ground of the heated appliance.

4. A circuit as in claim 1 where said heated appliance includes a soldering iron.

5. A circuit as in claim 1 where aid heated appliance includes a solder extractor.

6. A circuit as in claim 1 where said circuit means includes a slot for receiving at least a portion of the planar probe.

7. A circuit as in claim 6 where said electrical monitor circuitry includes a container and said slot is formed in one of the walls of the container.

8. A method of monitoring electrical signals emanating from a heating electrical appliance comprising the steps of
   providing a planar probe having three layers, the first layer including at least a first electrically conductive portion adapted to support a pool of molten solder, the second layer being an electrically insulating layer disposed between the first layer and a third layer, the third layer being electrically conductive;
   electrically connecting said probe to circuitry for monitoring said electrical signals;
   forming said pool of molten solder on said first portion of the first layer of the probe; and
   passing said electrical signals emanating from the heated appliance through (a) the molten solder pool and (b) the portion of the first layer of the planar probe to the circuitry for monitoring said electrical signals.

9. A method as in claim 8 including grounding said third layer of the probe.

10. A method as in claim 9, including grounding said monitoring circuitry and connecting the ground of the third layer to the ground of the monitoring circuitry.

11. A method as in claim 8 including providing said first layer of the planar probe with a second portion electrically isolated from the first portion thereof where said second portion and said third layer are grounded.

12. A method as in claim 8 where said heated electrical appliance includes a soldering iron or solder extractor.

* * * * *